(12) United States Patent
Shimizu et al.

(10) Patent No.: US 11,950,368 B2
(45) Date of Patent: Apr. 2, 2024

(54) FLEXIBLE PRINTED CIRCUIT

(71) Applicant: Yazaki Corporation, Tokyo (JP)

(72) Inventors: Hidehiko Shimizu, Shizuoka (JP); Tomohiro Sugiura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 116 days.

(21) Appl. No.: 17/851,504

(22) Filed: Jun. 28, 2022

(65) Prior Publication Data

US 2023/0007779 A1 Jan. 5, 2023

(30) Foreign Application Priority Data

Jun. 30, 2021 (JP) .................................. 2021-108723

(51) Int. Cl.
*H05K 1/18* (2006.01)
(52) U.S. Cl.
CPC ... *H05K 1/189* (2013.01); *H05K 2201/09036* (2013.01); *H05K 2201/10037* (2013.01); *H05K 2201/10272* (2013.01)
(58) Field of Classification Search
CPC ......... H05K 1/189; H05K 2201/09036; H05K 2201/10037; H05K 2201/1027
USPC ....................................................... 361/749
See application file for complete search history.

(56) References Cited

U.S. PATENT DOCUMENTS

| 2008/0264683 | A1 | 10/2008 | Watanabe et al. |
| 2014/0268780 | A1* | 9/2014 | Wang ..................... H05K 1/028 362/249.06 |
| 2015/0342045 | A1* | 11/2015 | Nakabayashi ....... G02B 6/0066 361/768 |
| 2017/0265299 | A1* | 9/2017 | Kitagawa ............. H05K 3/4015 |
| 2020/0274204 | A1 | 8/2020 | Dawley |

FOREIGN PATENT DOCUMENTS

| JP | 2004-235459 A | 8/2004 |
| JP | 2005-85807 A | 3/2005 |
| JP | 2007-180397 A | 7/2007 |
| JP | 2014-165441 A | 9/2014 |

* cited by examiner

*Primary Examiner* — Binh B Tran
(74) *Attorney, Agent, or Firm* — Sughrue Mion, PLLC

(57) ABSTRACT

A flexible printed circuit includes: a chip component serving as an electronic component having a first electrode and the like; a base film; a conductive first pattern layer which is laminated on a portion of the base film and has a bonding region to which the electrode is, for example, soldered; and a coverlay laminated on the base film or the first pattern layer via an adhesive and having an opening for externally exposing a portion of the first pattern layer including the bonding region, and the chip component. The first pattern layer has a groove that opens in a range between the bonding region and an edge of the opening on a surface of the first pattern layer.

10 Claims, 4 Drawing Sheets

FLEXIBLE PRINTED CIRCUIT

CROSS REFERENCE TO RELATED APPLICATION

The present application is based on, and claims priority from Japanese Patent Application No. 2021-108723, filed on Jun. 30, 2021, the entire contents of which are incorporated herein by reference.

TECHNICAL FIELD

The disclosure relates to a flexible printed circuit.

BACKGROUND

Conventionally, there are flexible printed circuits (FPCs) on which chip components serving as electronic components are mounted. Generally, in a flexible printed circuit, a pattern layer serving as a conductor circuit is laminated on a base film. A pattern layer has bonding regions as regions for soldering electrodes of chip components. Further, a coverlay for protecting the pattern layer or the like is laminated on the base film or the pattern layer. A coverlay has openings for externally exposing, for example, bonding regions.

A coverlay is bonded onto a base film by hot pressing via an adhesive. If the adhesive protrudes from the edge of an opening provided in the coverlay during bonding, the protruding adhesive may reach a bonding region. In this case, a desired bonding region cannot be secured, and as a result, the reliability of soldering may be reduced. Accordingly, J P 2004-235459 A discloses a technique for manufacturing a flexible printed circuit in which an adhesive layer around an opening is semi-cured half-hardened when a coverlay is bonded onto a base film in order to prevent such an adhesive from protruding.

SUMMARY

The manufacturing method disclosed in JP 2004-235459 A includes a step of heating only the peripheral portion of the opening in order to semi-cure the adhesive layer around the opening of the coverlay, and thus, this makes the overall process complicated. Further, for example, in a case where a large number of small chip components are mounted on a flexible printed circuit, the process becomes more complicated, and thus, it may be difficult to perform the semi-curing process for all openings.

An object of the disclosure is to provide a flexible printed circuit capable of easily suppressing deterioration in the reliability of soldering when mounting an electronic component.

A flexible printed circuit of an embodiment includes: an electronic component having an electrode; a base film; a conductive pattern layer which is laminated on a portion of the base film and has a bonding region to which the electrode is soldered; and a coverlay laminated on the base film or the pattern layer via an adhesive and having an opening for externally exposing a portion of the pattern layer including the bonding region, and the electronic component. The pattern layer has a groove that opens in a range between the bonding region and an edge of the opening on a surface of the pattern layer.

DETAILED DESCRIPTION

Various embodiments will be described hereinafter with reference to the accompanying drawings.

Hereinafter, a flexible printed circuit according to the respective embodiments will be described in detail with reference to the drawings. Dimension ratios of the drawings are exaggerated for convenience of explanation, and may be different from actual ratios.

First Embodiment

Figure 1:
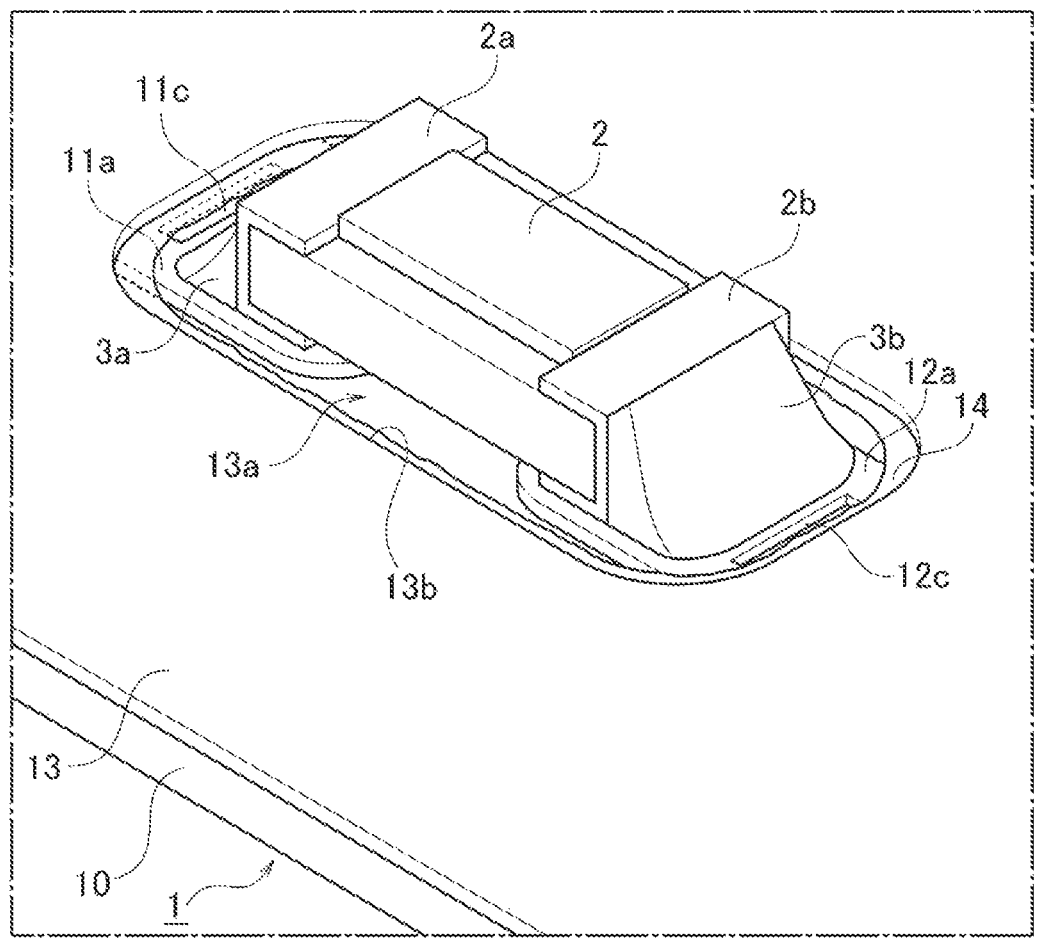
FIG. 1 is a perspective view of a flexible printed circuit according to a first embodiment.

FIG. 1 is a perspective view of a flexible printed circuit (hereinafter, abbreviated as "FPC") 1 according to the first embodiment. In FIG. 1, a portion of the FPC 1 is schematically drawn as an enlarged view in order to clarify a portion where a chip component 2 serving as an electronic component is mounted.

The FPC 1 is a circuit component for electrically connecting electronic devices to each other, and can be employed in devices in various fields due to having excellent flexibility. For example, the FPC 1 may be employed as a vehicle-mounted component in a bus bar module having a plurality of bus bars for connecting respective electrode terminals of adjacent battery cells among a plurality of battery cells included in a battery module. In this case, the FPC 1 electrically connects the plurality of bus bars in the bus bar module. A plurality of electronic components and connectors other than the chip component 2, which is exemplified below, are provided in the other portions of the FPC 1, but these elements will be omitted herein.

Figure 2A:
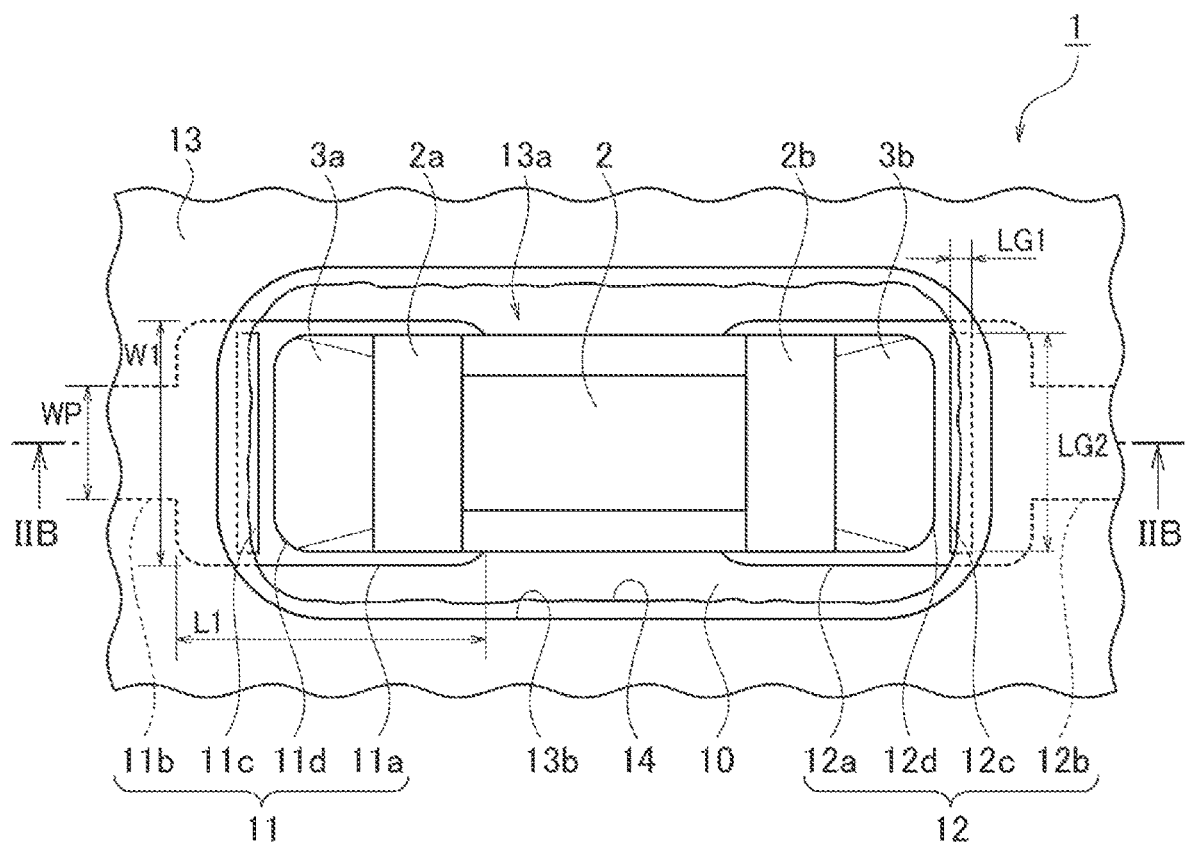
FIG. 2A is a plan view of an electronic component mounting portion in the first embodiment.
Figure 2B:
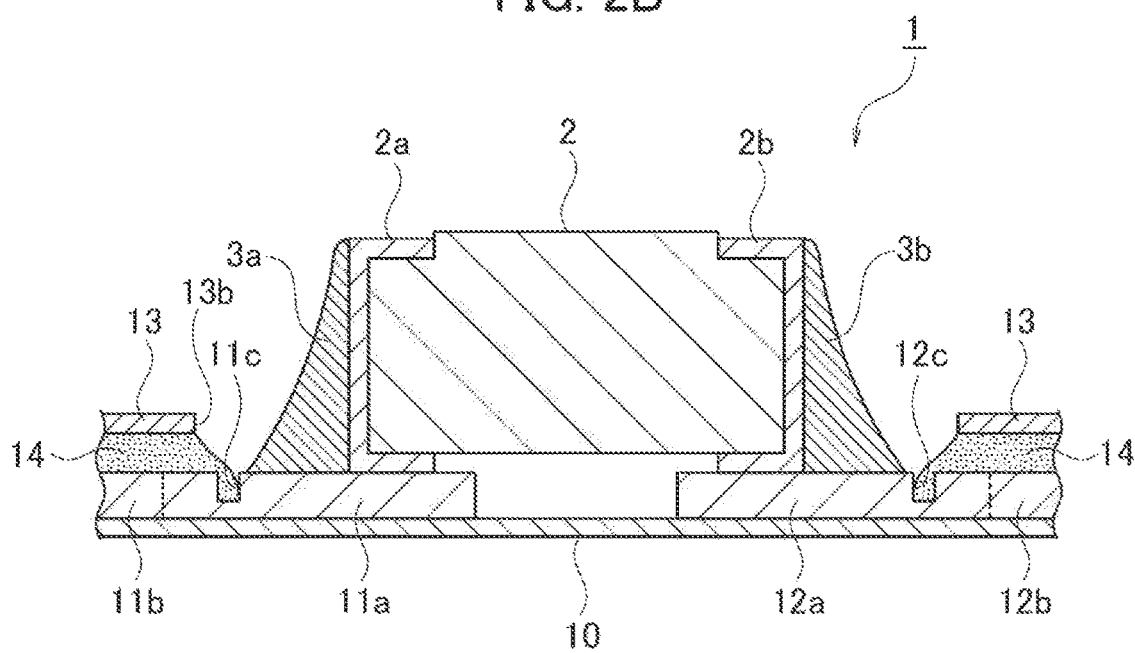
FIG. 2B is a cross-sectional view of the electronic component mounting portion in the first embodiment.

FIGS. 2A and 2B are enlarged schematic views of the mounting portion of the chip component 2 in the FPC 1. FIG. 2A is a plan view of the mounting portion. FIG. 2B is a cross-sectional view of the mounting portion corresponding to the IIB-IIB cross-section illustrated in FIG. 2A. The cross-sectional view illustrated in FIG. 2B is cut along a virtual plane passing through the approximate center of gravity of the chip component 2, and along the mounting direction of the chip component 2 and the direction in which a first electrode 2a and a second electrode 2b of the chip component 2 face each other. Here, the mounting direction of the chip component 2 corresponds to a direction perpendicular to the main plane of a base film 10.

The FPC 1 includes, for example, the chip component 2 serving as an electronic component having two electrodes, the first electrode 2a and the second electrode 2b. In the present embodiment, the chip component 2 is a block body extending in one direction with the first electrode 2a as one end and the second electrode 2b as the other end. The chip component 2 may be any electronic component such as a capacitor, a resistor, a coil or a semiconductor.

Further, the FPC 1 includes the base film 10, a first pattern layer 11 and a second pattern layer 12 constituting a pattern layer, and a coverlay 13.

The base film 10 is a base portion having excellent flexibility and a planar shape defining the overall shape of the FPC 1. The base film 10 is formed of, for example, a polyimide resin excellent in terms of heat resistance.

The pattern layer is a conductor circuit laminated on a portion of at least one main surface of the base film 10. The pattern layer is formed of a material having conductivity, for example, copper foil. In FIGS. 1, 2A and 2B, the first pattern layer 11 and the second pattern layer 12 are exemplified as a pattern layer related to the mounting portion of the chip component 2.

The first pattern layer 11 is a pattern layer connected to the first electrode 2a, which is one electrode of the chip component 2. The first pattern layer 11 includes a pad 11a and a pattern 11b.

The pad 11a is a portion where a bonding region 11d to which the first electrode 2a is soldered is set. The pad 11a has a generally rectangular planar shape. Hereinafter, the length along one direction of the pad 11a is defined as a pad length L1, and the width along the other direction perpendicular to one direction of the pad 11a is defined as a pad width W1. In the present embodiment, the above one direction in which the pad length L1 is defined is the same as the direction in which the first electrode 2a and the second electrode 2b face each other in the chip component 2.

The pattern 11b is continuous with a portion of the pad 11a and forms a wiring portion over the whole conductor circuit. Hereinafter, the width of the pattern 11b in the vicinity of the pad 11a is defined as a pattern width WP. In the present embodiment, the pattern width WP is parallel to the pad width W1 and is shorter than the pad width W1. The respective centers of the pattern width WP and the pad width W1 coincide with each other in the width direction in which these widths are defined.

The second pattern layer 12 is a pattern layer connected to the second electrode 2b which is the other electrode of the chip component 2. The second pattern layer 12 includes a pad 12a and a pattern 12b. The shapes of the pad 12a and the pattern 12b are symmetrical with the shapes of the pad 11a and the pattern 11b included in the first pattern layer 11. Like the pad 11a, the pad 12a is provided with a bonding region 12d to which the second electrode 2b is soldered.

The coverlay 13 is a protective layer which is laminated on the entire surface of the base film 10, that is, laminated on the base film 10 or the pattern layer, via an adhesive 14, and protects the pattern layer and the like. The adhesive 14 may be an epoxy adhesive containing an epoxy resin having excellent flexibility as a main component. The coverlay 13 has an opening 13a for externally exposing the pads 11a and 12a serving as a portion of the pattern layer, and the chip component 2. In order to reduce exposure of the base film 10 and the pattern layer to the outside as much as possible, the shape of an edge 13b of the opening 13a approximately follows the outer peripheral shape of the chip component 2, and the opening 13a does not come into contact with the chip component 2.

In mounting the chip component 2, the first electrode 2a is soldered to the pad 11a, and similarly, the second electrode 2b is soldered to the pad 12a. The soldering method may be, for example, a reflow method in which solder paste is applied in advance to the bonding region 11d or the like, the first electrode 2a or the like is placed on the applied solder paste, and then the solder paste is melted in a heating furnace to finally bond the objects to each other. In FIG. 1, FIG. 2A and FIG. 2B, a fillet 3a bonding the first electrode 2a to the bonding region 11d on the pad 11a and a fillet 3b bonding the second electrode 2b to the bonding region 12d on the pad 12a are drawn as the portions after soldering.

In the present embodiment, the pad 11a, which is a portion of the first pattern layer 11, has a groove 11c which opens in a range between the bonding region 11d and the edge 13b of the opening 13a in the coverlay 13 on the surface of the pad 11a. Similarly, the pad 12a, which is a portion of the second pattern layer 12, has a groove 12c which opens in a range between the bonding region 12d and the edge 13b of the opening 13a on the surface of the pad 12a. In the present embodiment, the groove 11c has the same opening shape as that of the groove 12c. For example, referring to the groove 12c in FIG. 2A, the opening shape of the groove 12c is a rectangle in which a groove width LG1 is constant. The groove width LG1 is the width in the direction in which the bonding region 12d and the edge 13b of the opening 13a face each other. Meanwhile, a groove length LG2, which is the length in the direction perpendicular to the groove width LG1, has approximately the same length as the length in the direction in which the bonding region 12d and the edge 13b of the opening 13a face each other. That is, the groove 12c faces the entire bonding region 12d.

Further, in the present embodiment, the portions of the respective pads 11a and 12a are positioned below the coverlay 13. Specifically, a portion of the outer peripheral region of the pad 11a, which faces the bonding region 11d across the groove 11c, is positioned below the coverlay 13. Similarly, a portion of the outer peripheral region of the pad 12a, which faces the bonding region 12d across the groove 12c, is positioned below the coverlay 13. Here, "below the coverlay 13" is not limited to a layer immediately below the coverlay 13, but refers to layers existing below the coverlay 13, that is, layers existing below sandwiching the adhesive layer composed of the adhesive 14 in the present embodiment.

Next, the operation of the FPC 1 will be described.

First, in order to further clarify the operation of the FPC 1 according to the present embodiment and the effect described later, an FPC as a comparative example will be presented.

Figure 3:
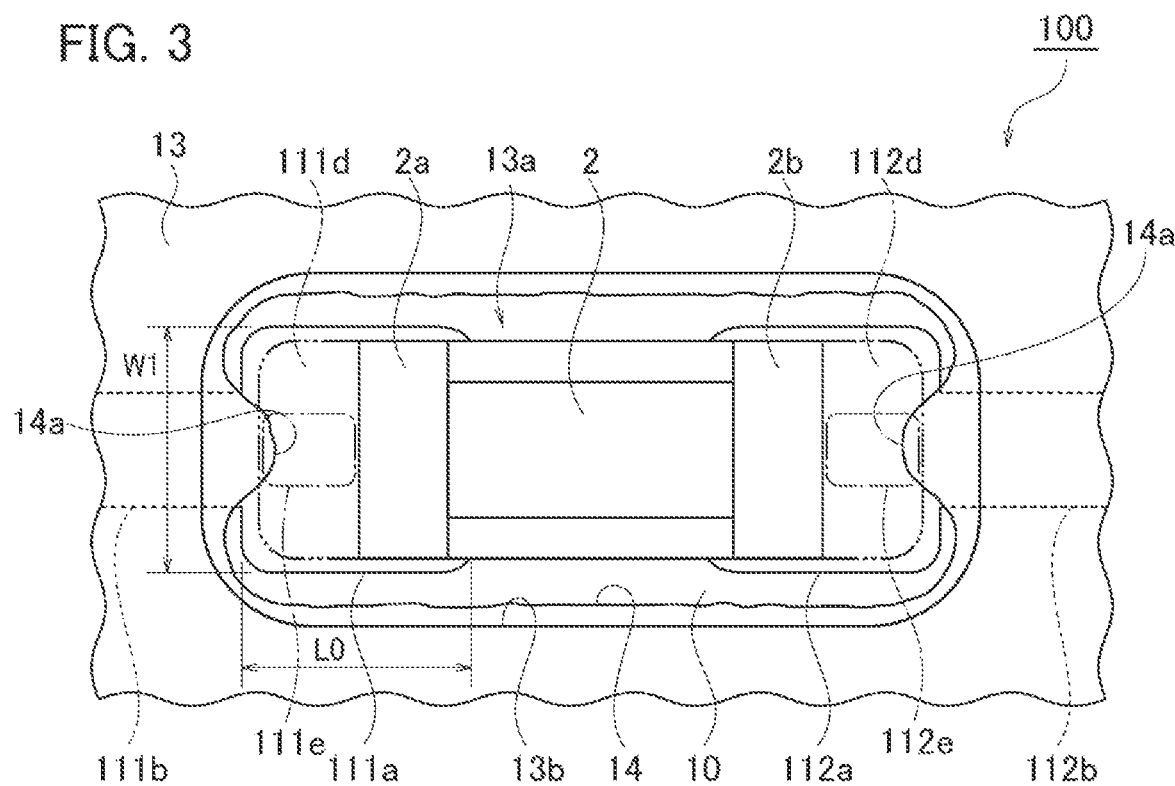
FIG. 3 is a plan view of an electronic component mounting portion as a comparative example.

FIG. 3 is an enlarged plan view of a mounting portion of the chip component 2 in an FPC 100 as a comparative example. The mounting portion illustrated in FIG. 3 is drawn in accordance with the mounting portion of the chip component 2 in the FPC 1 illustrated in FIG. 2A, the same reference numerals are given to the same portions, and a detailed description thereof will be omitted. In the FPC 100, as compared with the FPC 1, the shapes of the pads are different from each other, and there are no grooves corresponding to the grooves 11c and 12c in the present embodiment.

The FPC 100 includes a pad 111a and a pattern 111b in place of the pad 11a and the pattern 11b in the FPC 1. In particular, regarding the planar shape of the pad 111a, a pad length L0 is set to be shorter than the pad length L1 of the pad 11a such that the entire pad 111a is externally exposed from the opening 13a. The pad width of the pad 111a may be the same as the pad width W1 of the pad 11a. In this case, a portion of the pattern 111b continuing with the pad 111a is externally exposed from the opening 13a in the coverlay 13. Similarly, the FPC 100 includes a pad 112a and a pattern 112b in place of the pad 12a and the pattern 12b in the FPC 1.

Regarding the FPC 100, a state in which the chip component 2 is not yet mounted will be considered. The coverlay 13 is bonded onto the base film 10 or the pattern layer by heat pressurization via the adhesive 14. This heat pressurization may cause the adhesive 14 to protrude from the edge 13b of the opening 13a toward the inside of the opening 13a.

Here, the region where the pattern layer is not exposed in the opening 13a is lower than the height positions of the pads 111a and 112a. For this reason, even when the adhesive 14 protrudes from the edge 13b, it is difficult to reach the bonding region 111d set on the pad 111a, and the bonding region 112d set on the pad 112a.

However, in the region where the pattern layer is exposed in the opening 13a, the edge 13b of the opening 13a is continuous with the pattern 111b and the pad 111a, and the pattern 112b and the pad 112a. For this reason, if the adhesive 14 protrudes from the edge 13b and flows out onto the surface of the pattern 111b or the pattern 112b, the adhesive 14 may reach the bonding region 111d or the bonding region 112d. For example, as illustrated in FIG. 3, when the pattern 111b is continuous with the pad 111a toward a central region 111e of the bonding region 111d, a portion 14a of the adhesive 14 that has flowed onto the surface of the pattern 111b is likely to flow into the central region 111e. This is also the case in a central region 112e of the bonding region 112d set on the pad 112a. The inflow of the adhesive 14 into the bonding region 111d or the like leads to narrowing of the range of the bonding region 111d or the like, and as a result, this may reduce the reliability of soldering performed as a later step.

On the other hand, in the FPC 1 according to the present embodiment, the groove 11c is formed in advance in the pad 11a, and similarly, the groove 12c is formed in advance in the pad 12a. Accordingly, even when the adhesive 14 protrudes from the edge 13b and flows out onto the surface of the pad 11a or the pad 12a, the adhesive 14 flows down into the groove 11c or the groove 12c as illustrated in FIGS. 2A and 2B, thereby making it difficult to reach the bonding region 11d or the bonding region 12d.

Next, the effect of the FPC 1 will be described.

The FPC 1 according to the present embodiment includes an electronic component having an electrode. The FPC 1 includes the base film 10, and a conductive pattern layer laminated on a portion of the base film 10 and having a bonding region to which the electrode is soldered. Further, the FPC 1 includes the coverlay 13 which is laminated on the base film 10 or the pattern layer via the adhesive 14. The coverlay 13 has the opening 13a for externally exposing a portion of the pattern layer including the bonding region, and the electronic component. The pattern layer has a groove that opens in a range between the bonding region and the edge 13b of the opening 13a on the surface of the pattern layer.

Here, the electronic component corresponds to the above chip component 2. The electrode corresponds to the above first electrode 2a and the above second electrode 2b. The pattern layer corresponds to the above first pattern layer 11 and the above second pattern layer 12. The bonding region corresponds to the above bonding region 11d and the above bonding region 12d. The groove corresponds to the above groove 11c and the above groove 12c.

In the following description regarding the effect, the portion relating to the first pattern layer 11 will be specifically discussed for the sake of simplicity, and the same will be applied to the portion relating to the second pattern layer 12.

Even when the adhesive 14 protrudes from the edge 13b and flows out onto the surface of the pad 11a during the bonding of the coverlay 13 before the chip component 2 is mounted, the adhesive 14 flows down into the groove 11c. As a result, this makes it difficult for the adhesive 14 to reach the bonding region 11d set on the pad 11a, and thus, this is less likely to cause the range of the bonding region 11d to be narrowed by the inflow of the adhesive 14 into the bonding region 11d. Accordingly, when the chip component 2 is mounted as a later step, the FPC 1 makes it possible to avoid, in advance, the failure of not being possible for solder paste to be applied to a desired range of the bonding region 11d, thereby causing a defect in soldering thereafter.

Further, as a structure for suppressing the inflow of the adhesive 14 into the bonding region such as the bonding region 11d, in the FPC 1, only a groove such as the groove 11c is formed in a portion of the pattern layer exposed from the opening 13a. Accordingly, even when the chip component 2 is small or the number of mounted chip components 2 is large, it is possible to suppress the complexity of the manufacturing process of the FPC 1.

As described above, the present embodiment makes it possible to provide the FPC 1 for easily suppressing deterioration in the reliability of soldering when mounting an electronic component.

Further, assuming that the adhesive 14 protrudes when the coverlay 13 is bonded, for example, it is conceivable for the opening 13a is to be set in advance to be large in size such that the protruding adhesive 14 does not easily reach the bonding region 11d. However, setting the opening 13a to be large in size means that the range of the pattern layer exposed from the opening 13a increases, and thus this is undesirable from the viewpoint of protecting the pattern layer.

Meanwhile, in the FPC 1, it is only necessary to form the groove 11c in a portion of the pattern layer exposed from the opening portion 13a, and this makes it possible to avoid a large diameter for the opening portion 13a. For example, when the chip component 2 is small, it is assumed that the protruding amount of the adhesive 14 is about 0.2 mm. In this case, assuming that the groove 11c does not exist, the opening gap between a portion of the pattern layer in which the bonding region 11d is set and the edge 13b of the opening 13a needs to be 0.2 mm or more. In contrast, in the case of the FPC 1 having the groove 11c, this opening gap can be set to 0.2 mm or less.

Further, in the FPC 1 according to the present embodiment, the groove may face the entire bonding region.

For example, the FPC 1 makes it possible to guide the adhesive 14 that is about to travel from the edge 13b of the opening 13a to the bonding region 11d via the surface of the pattern layer, to the groove 11c more reliably, thereby making it difficult for the adhesive 14 to reach the bonding region 11d.

In the FPC 1 according to the present embodiment, the opening shape of the groove may be a rectangle having a constant width in the direction in which the bonding region and the edge 13b of the opening 13a face each other.

The FPC 1 makes it possible to easily guide the adhesive 14 to the groove 11c without reaching a position where the adhesive 14 protrudes from the edge 13b of the opening 13a. Further, since the opening shape of the groove is simplified, this is advantageous in avoiding complication of the manufacturing process of the FPC 1.

In the FPC 1 according to the present embodiment, the pattern layer may include a pad where a bonding region is set. In this case, the groove may be formed in the pad.

According to the FPC 1, for example, since the groove 11c is formed in the pad 11a where the bonding region 11d is set, the opening shape of the groove 11c can be set to be wide in accordance with the range of the bonding region 11d.

In the FPC 1 according to the present embodiment, a portion of the outer peripheral region of the pad faces the bonding region across the groove, and this portion may be positioned below the coverlay 13.

According to the FPC 1, for example, since the groove 11c can be formed at a position corresponding to the edge 13b of the opening portion 13a, the opening shape of the groove 11c can be set as wide as possible within a range between the bonding region and the edge 13b of the opening portion 13a.

In the description using the above figures, a case where a groove such as the groove 11c is formed in a pad such as the pad 11a is exemplified. However, there may be a case where the difference between the pad 11a and the pattern 11b is small in the pattern layer, for example, when the pattern width WP of the pattern 11b continuous with the pad 11a is set in advance to be equal to the pad width W1 of the pad 11a. In such a case, the groove 11c may be formed in the pattern 11b.

Second Embodiment

Figure 4:
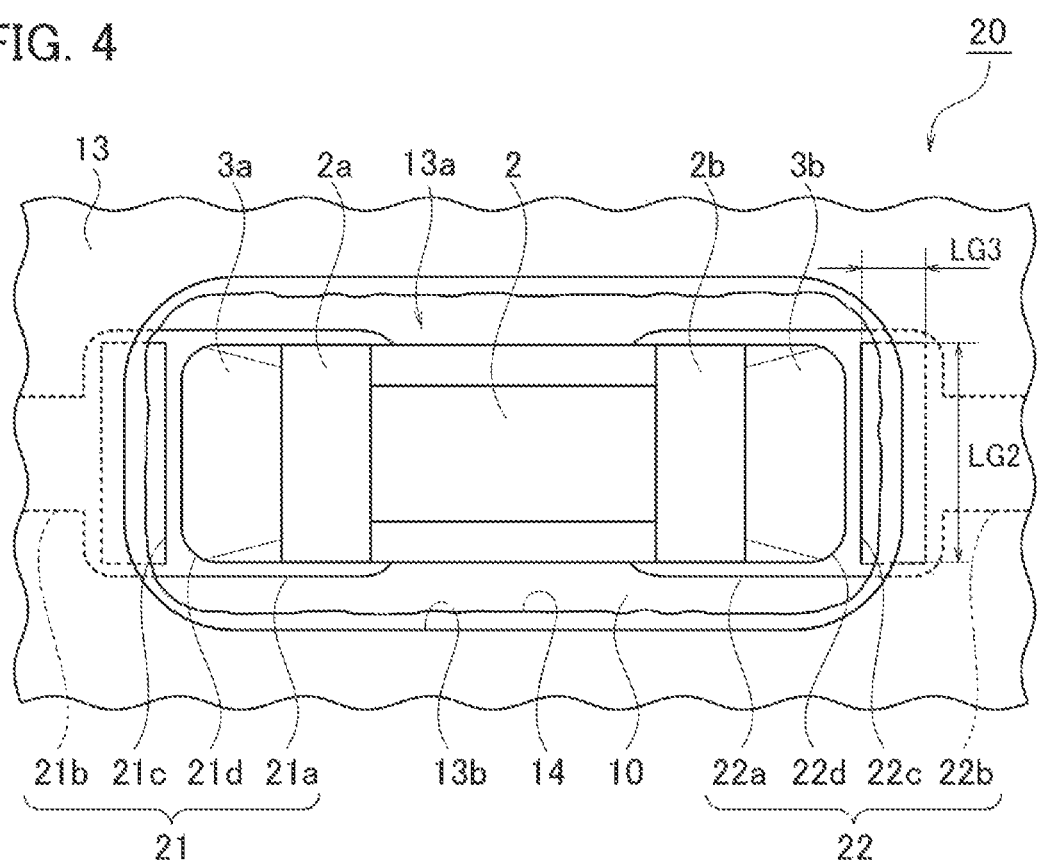
FIG. 4 is a plan view of an electronic component mounting portion in a second embodiment.

FIG. 4 is an enlarged plan view of a mounting portion of the chip component 2 in an FPC 20 according to the second embodiment. The mounting portion illustrated in FIG. 4 is drawn in accordance with the mounting portion of the chip component 2 in the FPC 1 illustrated in FIG. 2A, and the same reference numerals are given to the same portions, and a detailed description thereof will be omitted.

The FPC 20 includes, instead of the first pattern layer 11 in the FPC 1 according to the first embodiment, a first pattern layer 21 having a pad 21a in which a bonding region 21d is set and a groove 21c is formed and a pattern 21b. Similarly, instead of the second pattern layer 12 in the FPC 1 according to the first embodiment, the FPC 20 includes a second pattern layer 22 having a pad 22a in which a bonding region 22d is set and a groove 22c is formed and a pattern 22b.

In the present embodiment, the groove 21c and the groove 22c have the same opening shape. For example, referring to the groove 22c in FIG. 4, the opening shape of the groove 22c is a rectangle in which a groove width LG3 is constant. The groove width LG3 is the width in the direction in which the bonding region 22d and the edge 13b of the opening 13a face each other. Meanwhile, the groove length LG2, which is the length in the direction perpendicular to the groove width LG3, is, for example, the same as the groove length LG2 in the groove 12c in the first embodiment.

A portion of the groove 21c or the groove 22c in the present embodiment may be positioned below the coverlay 13, unlike the groove 11c or 12c in the first embodiment. According to the FPC 20, referring to the groove 21c as a representative example, as can be seen from the comparison of the groove width LG1 of the groove 11c in the first embodiment, the groove width LG3 can be set to be large, and thus the opening shape of the groove 21c can be set to be larger. Accordingly, even when the amount of the adhesive 14 protruding from the edge 13b of the opening 13a is relatively large, it is difficult for the adhesive 14 to reach the bonding region 21d.

Third Embodiment

Figure 5:
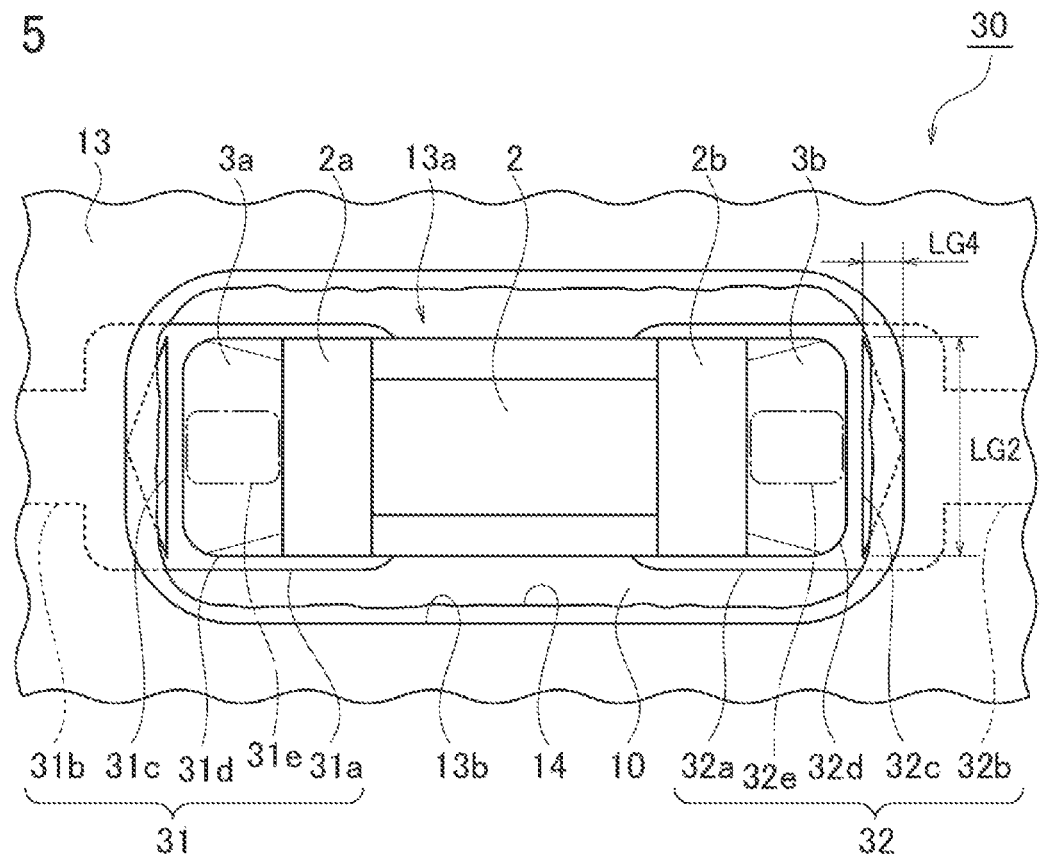
FIG. 5 is a plan view of an electronic component mounting portion in a third embodiment.

FIG. 5 is an enlarged plan view of a mounting portion of the chip component 2 in an FPC 30 according to the third embodiment. The mounting portion illustrated in FIG. 5 is drawn in accordance with the mounting portion of the chip component 2 in the FPC 1 illustrated in FIG. 2A, and the same reference numerals are given to the same portions, and a detailed description thereof will be omitted.

The FPC 30 includes, instead of the first pattern layer 11 in the FPC 1 according to the first embodiment, a first pattern layer 31 having a pad 31a in which a bonding region 31d is set and a groove 31c is formed and a pattern 31b. Similarly, instead of the second pattern layer 12 in the FPC 1 according to the first embodiment, the FPC 30 includes a second pattern layer 32 having a pad 32a in which a bonding region 32d is set and a groove 32c is formed and a pattern 32b. In FIG. 5, the bonding region 31d illustrates a central region 31e where the central portion of the fillet 3a is bonded, and the bonding region 32d illustrates a central region 32e where the central portion of the fillet 3b is bonded.

In the present embodiment, the groove 31c and the groove 32c have the same opening shape. For example, referring to the groove 32c in FIG. 5, the opening shape of the groove 32c may be an isosceles triangle having a side facing the bonding region 32d as a base and a side facing the edge 13b of the opening portion 13a as a vertex. In this case, the length connecting the shortest distance between the vertex and the base is a groove width LG4. Meanwhile, the groove length LG2, which corresponds to the length of the base, in the direction perpendicular to the groove width LG4 is, for example, the same as the groove length LG2 in the groove 12c of the first embodiment.

According to the FPC 30, referring to the groove 31c as a representative example, the opening shape of the groove 31c is wider in the portion of the bonding region 31d facing the central region 31e, and narrower toward both ends in the width direction from the central region 31e. The groove 31c makes it possible to prevent the adhesive 14 from reaching the central portion of the fillet 3a formed after soldering. The suitability of bonding due to soldering is easily affected by whether or not the central portion of the fillet 3a is soldered appropriately. Accordingly, setting the opening shape of the groove 31c to an isosceles triangle as described above makes it possible to prevent the adhesive 14 from reaching at least the central region 31e.

It should be noted that the isosceles triangles, which are the opening shapes of the grooves 31c and 32c, need not be strictly defined by the lengths and angles of the respective sides, and may be slightly modified in a range where the above effect is achieved. A portion of the groove 31c and the groove 32c may be positioned below the coverlay 13 as in the second embodiment.

Fourth Embodiment

Figure 6:
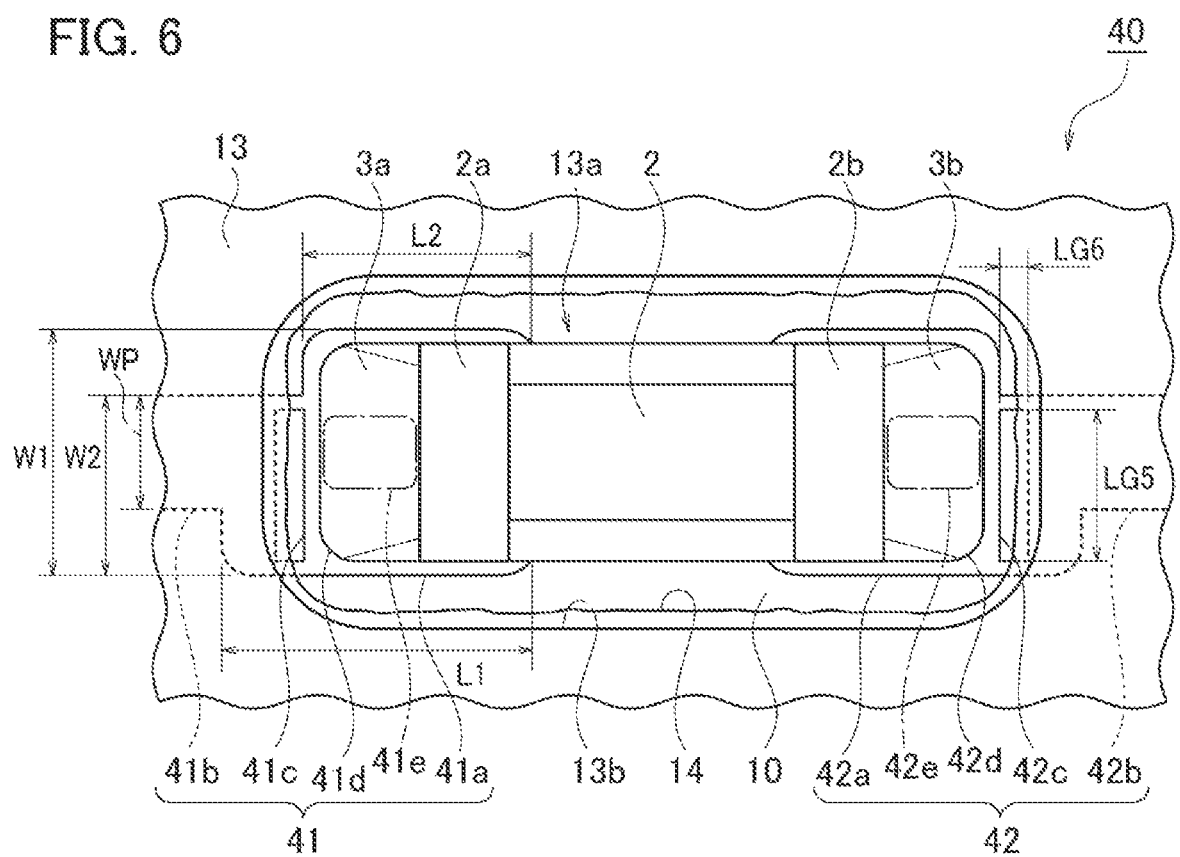
FIG. 6 is a plan view of an electronic component mounting portion in a fourth embodiment.

FIG. 6 is an enlarged plan view of a mounting portion of the chip component 2 in an FPC 40 according to the fourth embodiment. The mounting portion illustrated in FIG. 6 is drawn in accordance with the mounting portion of the chip component 2 in the FPC 1 illustrated in FIG. 2A, and the same reference numerals are given to the same portions, and a detailed description thereof will be omitted.

The FPC 40 includes, instead of the first pattern layer 11 in the FPC 1 according to the first embodiment, a first pattern layer 41 having a pad 41a in which a bonding region 41d is set and a groove 41c is formed and a pattern 41b. Similarly, instead of the second pattern layer 12 in the FPC 1 according to the first embodiment, the FPC 40 includes a second pattern layer 42 having a pad 42a in which a bonding region 42d is set and a groove 42c is formed and a pattern 42b. In FIG. 6, the bonding region 41d illustrates a central region 41e where the central portion of the fillet 3a is bonded, and the bonding region 42d illustrates a central region 42e where the central portion of the fillet 3b is bonded.

In the present embodiment, the shapes of the pads 41a and 42a are different from those of the pads 11a and 12a in the first embodiment. Referring to the pad 41a as a representative example, the pad 41a has a shape equivalent to that of the pad 11a in the first embodiment only in a portion where the groove 41c is formed so as to face a portion of the bonding region 41d including the central region 41e. Since the remaining portion of the pad 41a does not need to have a groove formed therein, only a shape necessary to secure the bonding region 41d is formed therein.

For example, in the area of the pad 41a where the groove 41c is formed, the pad length L1 is the same as the pad length L1 in the first embodiment, and the pad width W2 is shorter than the pad width W1 in the first embodiment. Further, the pattern 41b is connected within the area of the pad 41a where the groove 41c is formed, and faces the central region 41e of the bonding region 41d.

Meanwhile, in the other area of the pad 41a, the pad width W1 is the same as the pad width W1 in the first embodiment, and the pad length L1 is shorter than the pad length L1 in the first embodiment. This area of the pad 41a is not in contact with the edge 13b of the opening 13a.

In the present embodiment, the groove 41c and the groove 42c have the same opening shape. For example, referring to the groove 42c in FIG. 6, the groove 42c may face a portion of the bonding region 42d including the central region 42e. Specifically, the opening shape of the groove 42c is a rectangle in which a groove width LG6 is constant. The groove width LG6 is the width in the direction in which a portion of the bonding region 42d including the central region 42e, and the edge 13b of the opening 13a face each other. Meanwhile, a groove length LG5, which is the length in the direction perpendicular to the groove width LG6, has a length facing a portion of the bonding region 42d including the central region 42e. In other words, according to the specification of the groove 42c in the present embodiment, the opening shape of the groove 42c can be set such that a portion of the groove 42c faces the central region 42e and approaches one end side in the width direction of the pad 42a, as illustrated in FIG. 6.

Referring to the groove 41c as a representative example, the groove 41c faces a portion of the bonding region 41d including the central region 41e, the FPC 40 makes it possible to prevent the adhesive 14 from reaching at least the central region 41e as in the third embodiment.

A portion of the groove 41c and the groove 42c may be positioned below the coverlay 13 as in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible printed circuit comprising:
an electronic component having an electrode;
a base film;
a conductive pattern layer which is laminated on a portion of the base film and has a bonding region to which the electrode is soldered; and
a coverlay laminated on the base film or the conductive pattern layer via an adhesive and having an opening for externally exposing a portion of the conductive pattern layer including the bonding region, and the electronic component, wherein
the conductive pattern layer has a groove that opens in a range between the bonding region and an edge of the opening on a surface of the conductive pattern layer, and
a portion of the groove is positioned below the coverlay.

2. The flexible printed circuit according claim 1, wherein the groove faces the entire bonding region.

3. The flexible printed circuit according claim 1, wherein the groove faces a portion of the bonding region including a central region.

4. The flexible printed circuit according to claim 1, wherein
an opening shape of the groove is a rectangle having a constant width in a direction in which the bonding region and the edge of the opening face each other.

5. The flexible printed circuit according to claim 1, wherein
an opening shape of the groove is an isosceles triangle having a side facing the bonding region as a base and a side facing the edge of the opening portion as a vertex.

6. The flexible printed circuit according to claim 1, wherein
the conductive pattern layer includes a pad where the bonding region is set, and
the groove is formed in the pad.

7. The flexible printed circuit according claim 6, wherein
a portion of an outer peripheral region of the pad faces the bonding region across the groove and is positioned below the coverlay.

8. The flexible printed circuit according to claim 1, wherein
the flexible printed circuit is included in a bus bar module having a plurality of bus bars for connecting respective electrode terminals of adjacent battery cells, and electrically connects the plurality of bus bars.

9. A flexible printed circuit comprising:
an electronic component having an electrode;
a base film;
a conductive pattern layer which is laminated on a portion of the base film and has a bonding region to which the electrode is soldered; and
a coverlay laminated on the base film or the conductive pattern layer via an adhesive and having an opening for externally exposing a portion of the conductive pattern layer including the bonding region, and the electronic component, wherein
the conductive pattern layer has a groove that opens in a range between the bonding region and an edge of the opening on a surface of the conductive pattern layer, and
the groove faces the entire bonding region.

10. an electronic component having an electrode;
a base film;
a conductive pattern layer which is laminated on a portion of the base film and has a bonding region to which the electrode is soldered; and
a coverlay laminated on the base film or the conductive pattern layer via an adhesive and having an opening for externally exposing a portion of the conductive pattern layer including the bonding region, and the electronic component, wherein the conductive pattern layer has a groove that opens in a range between the bonding region and an edge of the opening on a surface of the conductive pattern layer, and the groove faces a portion of the bonding region including a central region.

* * * * *